(12) United States Patent
So

(10) Patent No.: US 7,945,874 B2
(45) Date of Patent: May 17, 2011

(54) METHOD FOR DESIGNING DRIVER

(75) Inventor: Sun-Man So, Seocho-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 359 days.

(21) Appl. No.: 12/145,311

(22) Filed: Jun. 24, 2008

(65) Prior Publication Data

US 2009/0007029 A1 Jan. 1, 2009

(30) Foreign Application Priority Data

Jun. 26, 2007 (KR) .................. 10-2007-0062807

(51) Int. Cl.
*G06F 17/50* (2006.01)
(52) U.S. Cl. .................................... 716/100
(58) Field of Classification Search .............. 716/1, 2, 716/100
See application file for complete search history.

(56) References Cited

U.S. PATENT DOCUMENTS 6,978,229 B1* 12/2005 Saxena et al. ............... 703/4
2008/0048267 A1* 2/2008 Richardson et al. ......... 257/365

* cited by examiner

*Primary Examiner* — Jack Chiang
*Assistant Examiner* — Suchin Parihar
(74) *Attorney, Agent, or Firm* — Sherr & Vaughn, PLLC

(57) ABSTRACT

A method for designing a driver including matching stages having transistors matched to each other is disclosed, including interpreting an offset caused by a mismatched characteristic difference of a plurality of transistors using a current change in a matching stage. A size of the transistors may be determined using the results of interpreting of the offset, and the size may be adjusted until a simulated yield of the driver obtained by a simulation using measured matching information and the determined size of the transistors approximates a targeted yield. The resulting determined size may be used to fabricate the driver, to obtain a test yield of the manufactured driver. If the test yield is not the targeted yield, the measured matching information may be adjusted until the adjusted yield of the driver obtained by the simulation approximates the test yield. Therefore, the offset of the driver may be minimized, making it possible to improve output characteristics of the driver, optimize the area, improve the yield, reduce the frequency of revisions in the development of the chip, and/or shorten the period of the chip design.

11 Claims, 5 Drawing Sheets

METHOD FOR DESIGNING DRIVER

The present application claims priority under 35 U.S.C. 119 to Korean Patent Application No. 10-2007-0062807 (filed on Jun. 26, 2007), which is hereby incorporated by reference in its entirety.

BACKGROUND

FIG. 1 is a view schematically showing a source driver according to the related art. The source driver includes a digital input stage 12, a digital to analog converter (DAC) 14, and an analog buffer stage 16. The source driver shown in FIG. 1 supplies a driving voltage for driving a data line to a panel, for example an LCD flat panel. Similarly, a gate driver applies a driving voltage for driving a gate line of a panel.

FIG. 2 is a graph illustrating characteristics of the buffer stage 16 in the source driver. The horizontal axis indicates the number of an individual output buffer and the vertical axis indicates an output voltage from each buffer. DVO indicates a deviation of the output voltage.

The digital input stage 12 receives digital data and outputs the data to the digital to analog converter 14. The DAC 14 converts the digital data into analog voltages, and the buffer stage 16 receives the converted analog voltages from the DAC 14, and outputs the driving voltage for driving the panel. The source driver may be integrated into a chip 10. The buffer stage 16 may be arranged with several hundred buffers 20, equal to the number of outputs of the source driver 10. The image quality of the panel depends on the characteristics of the source driver. The characteristics of the source driver depend on how equally the several hundred buffers generate outputs. However, when the same voltage is applied to the source driver, the outputs from the several hundred buffers may have a difference of tens to several hundred mV as shown in FIG. 2. This is caused by an offset generated in the fabricating process of the buffer. Therefore, to increase the yield of the chip 10, the offset characteristics should be good. Also, the improvement of the offset characteristics is intimately associated with the area of the chip. Therefore, a good offset and an optimal area are directly associated with the unit cost of the chip 10. Related methods for improving the output characteristic of the source driver have attempted only empirical approaches. Therefore, many revisions of repetitive chip designs have been demanded due to the empirical approaches, thereby increasing the development time and cost of the chip.

SUMMARY

Embodiments relate to a design of a driver, and in particular to a method of designing a driver capable of reducing an offset voltage. Embodiments relate to a method of designing a driver improving an offset characteristic of a driver. Embodiments relate to a method of designing a driver including matching stages having transistors matched to each other, including interpreting an offset caused by a mismatched characteristic difference of a plurality of transistors using a current change in a matching stage. A size of the transistors may be determined using the results of interpreting of the offset, and the size may be adjusted until a simulated yield of the driver obtained by a simulation using measured matching information and the determined size of the transistors approximates a targeted yield. The resulting determined size may be used to fabricate the driver, to obtain a test yield of the manufactured driver. If the test yield is not the targeted yield, the measured matching information may be adjusted until the adjusted yield of the driver obtained by the simulation approximates the test yield.

DRAWINGS

Figure 3:
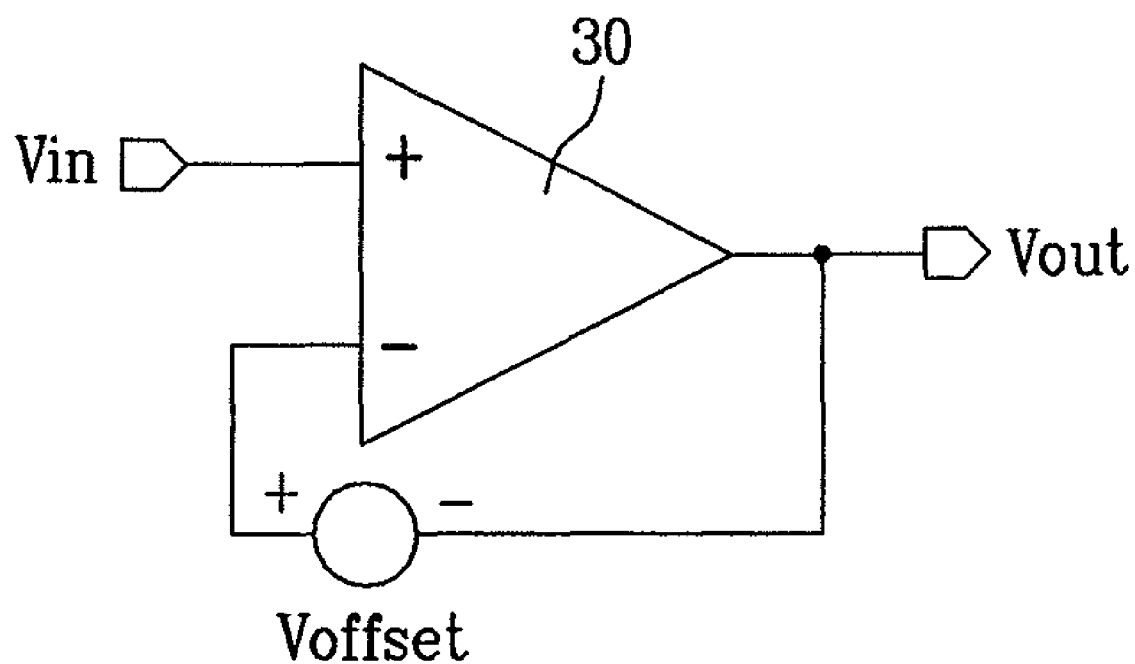

Example FIG. 3 is a view showing an operational amplifier with an offset according to embodiments.

Figure 4:
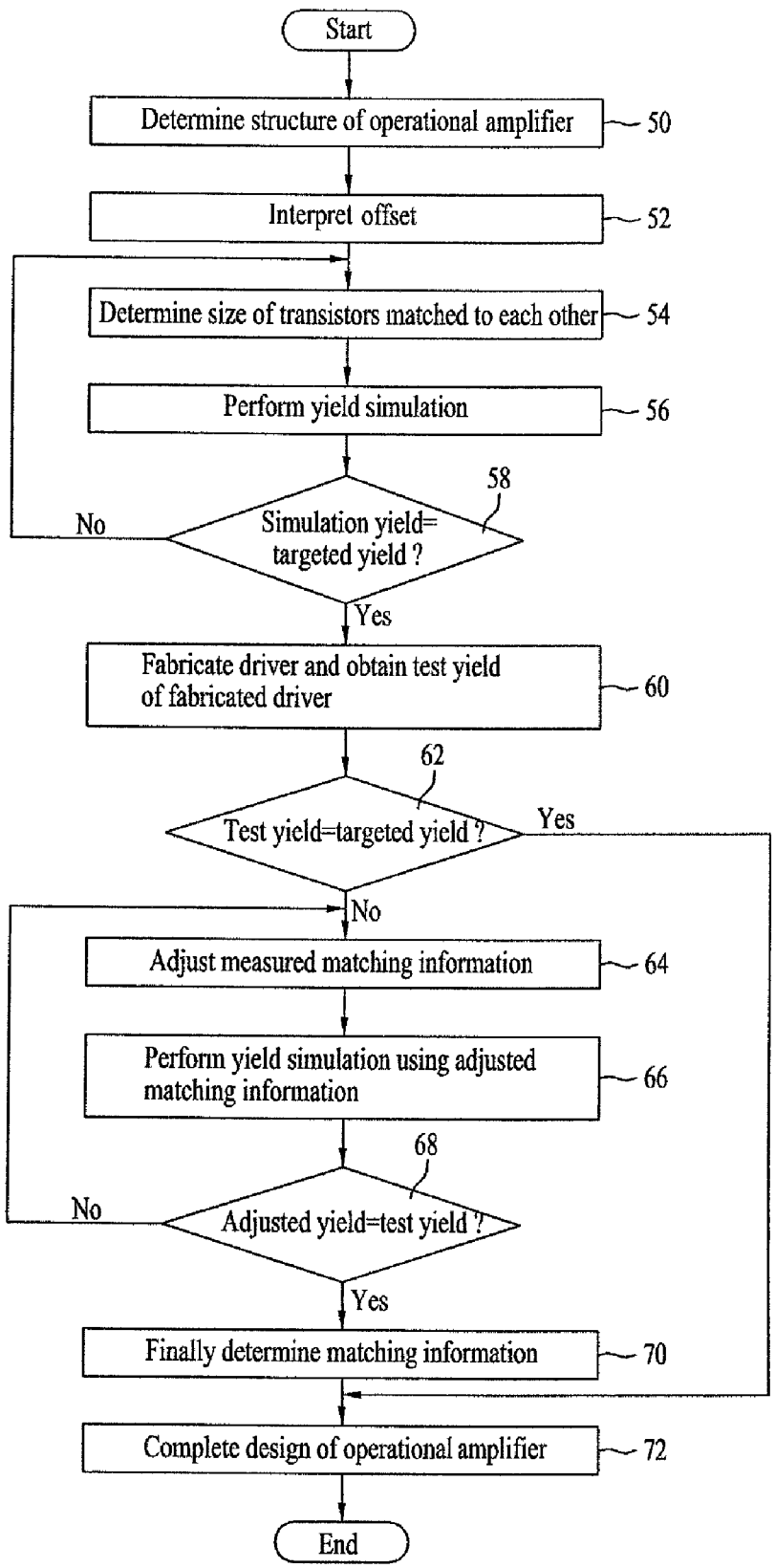

Example FIG. 4 is a flow chart illustrating the method for fabricating a driver according to embodiments.

Figure 5:
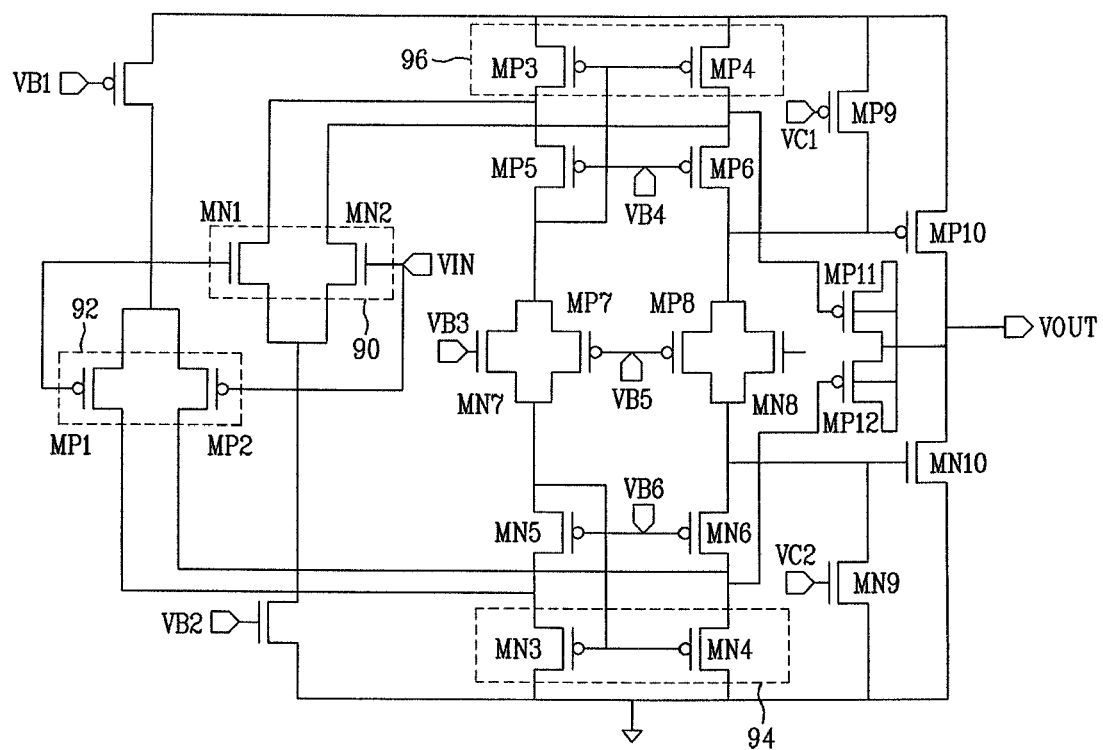

Example FIG. 5 is a view illustrating a folded cascade operational amplifier.

DESCRIPTION

Figure 1:
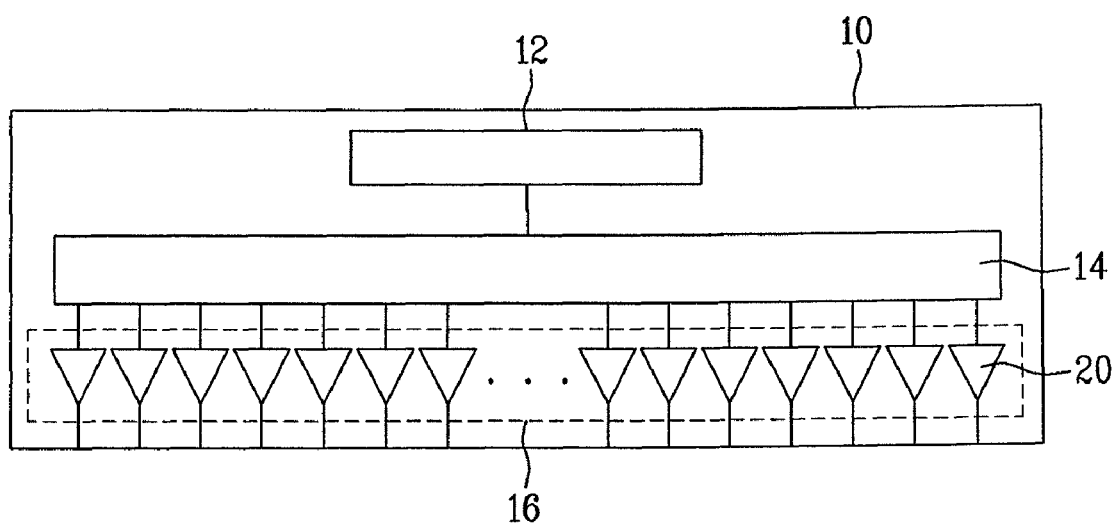
FIG. 1 is a view schematically showing a related source driver.
Figure 2:
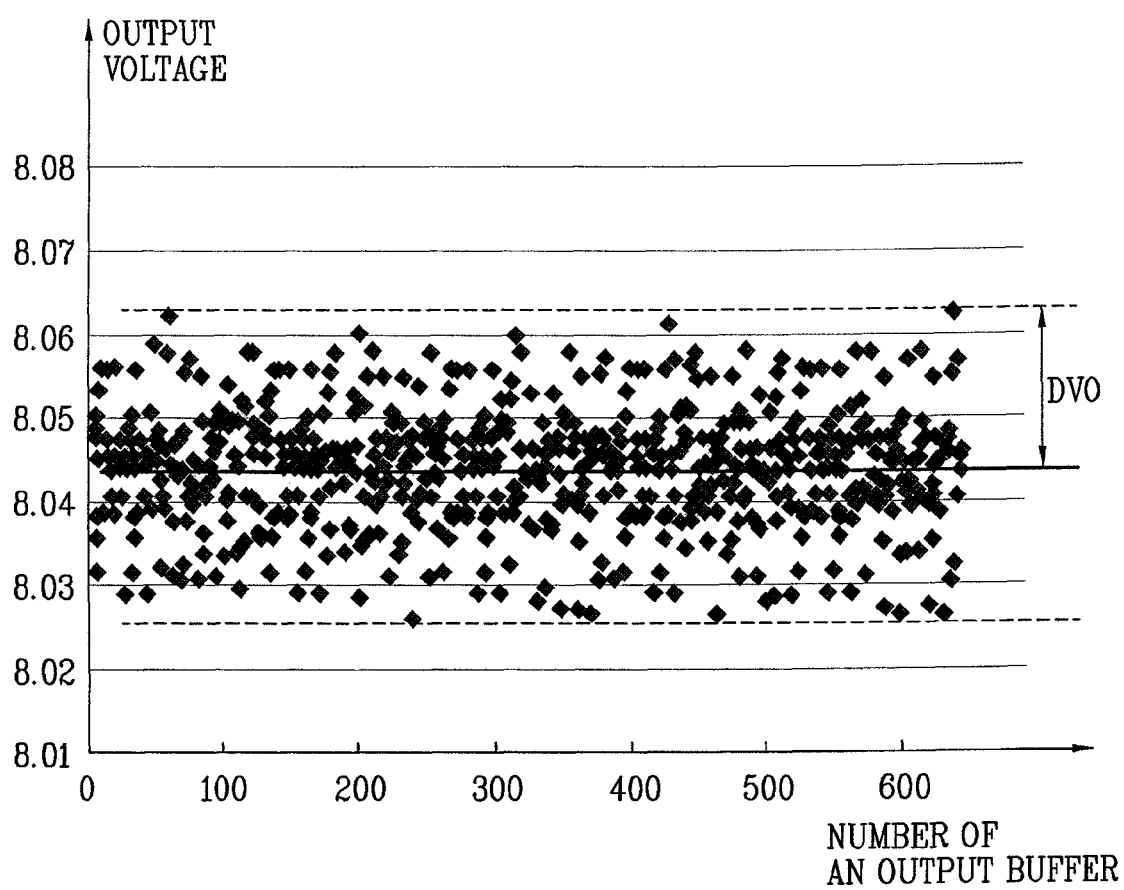
FIG. 2 is a graph illustrating a characteristic of a buffer stage in a source driver.

For the sake of understanding, it may be helpful to imagine that a driver to be designed according to embodiments is a source driver shown in FIG. 1 and each buffer 20 is implemented by an operational (OP) amplifier. However, embodiments are not limited thereto.

Example FIG. 3 is a view showing an operational amplifier to be designed by the method for designing the driver according to embodiments and an offset (Voffset) thereof.

Referring to example FIG. 3, both a random offset and a systematic offset combine towards the total offset of the operational amplifier 30. The systematic offset is regular and predictable, so that it is removed easily. However, the random offset inevitably occurs in a fabricating process of the driver, and removal of this component of the total offset voltage is difficult. The random offset is caused when transistors in an important matching stage are actually mismatched. In other words, as shown in example FIG. 3, the transistors in an important matching stage inside the operational amplifier 30 are mismatched, causing an offset.

Example FIG. 4 is a flow chart illustrating a method for fabricating the driver according to embodiments. The method for fabricating the driver according to embodiments includes interpreting a structure of an operational amplifier by the offset of the operational amplifier (steps 50 and 52), determining the size of the matched transistors according to the simulated yield (steps 54 to 58), determining the yield of the fabricated driver by adjusting the measured matching information (steps 60 to 70), and completing the design of the operational amplifier (step 72).

The operational amplifier of the driver to be designed according to embodiments will first be described. The operational amplifier has at least one matching stage. Among several matching stages, the most important matching stage is referred to as an "important matching stage". The important matching stage has a voltage input stage with matched transistors, and an active load stage outputting current and having the transistors matched to each other.

First, the structure of the operational amplifier in the buffer included in the driver to be designed is determined (step 50). A two-stage operational amplifier or folded cascade operational amplifier may be determined for use in the buffer and a structure of the operational amplifier having matched transistors may be then determined for use in the buffer.

Example FIG. 5 is a view illustrating a folded cascode operational amplifier. The folded cascode operational amplifier includes input stages 90 and 92, active load stages 94 and 96, and transistors MP5 to MP12 and MN5 to MN10. Herein, VIN indicates voltage input to the operational amplifier and VOUT indicates voltage output from the operational amplifier.

The operational amplifier shown in example FIG. 5 has the same principle as the operational amplifier shown in FIG. 1 of U.S. Pat. No. 5,311,145 and therefore, the detailed description thereof will be omitted. However, the operational amplifier disclosed in the above-mentioned patent shows a bias form in detail, while the operational amplifier shown in example FIG. 5 does not show bias voltages VB1 to VB6 in detail but omits them. Furthermore, the operational amplifier shown in example FIG. 5 separates control voltages VC1 and VC2 which apply switching signals for controlling the on/off state of the output of the operational amplifier.

The operational amplifier shown in example FIG. 5 has a plurality of transistors matched to each other, but only the offset of the important matching stages largely affecting the offset will be described. In example FIG. 5, the important matching stages are input stages 90 and 92 represented by the offset voltage, and active load stages 94 and 96 for sourcing the current. The input stage 90 is configured of transistors MN1 and MN2 matched to each other, and the input stage 92 is configured of transistors MP1 and MP2 matched to each other. The active load stage 94 is configured of transistors MN3 and MN4 matched to each other, and the active load stage 96 is configured of transistors MP3 and MP4 matched to each other.

Hereinafter, steps 52 to 72 will be described under the assumption that the structure of the operational amplifier shown in example FIG. 5 is determined at step 50, but embodiments are not limited thereto.

After the step 50, the offset caused by the mismatched characteristic difference in the transistors is interpreted (step 52) using the change in current of the matching stages 90 to 96. Herein, the characteristic difference in the matched transistors means the difference in the threshold voltage of the transistors. If a change in current occurs at the matching stage, the offset $V_{offset}$ may be expressed by Equation 1.

$$V_{offset} = \frac{\Delta I}{g_m} \quad \text{Equation 1}$$

Where $\Delta I$ indicates the change in current and $g_m$ indicates a transconductance of an input. For example, if the mismatching components generated in the four matching stages 90 to 96 shown in example FIG. 5 are expressed by the offset $V_{offset}$, they are represented by the following Equation 2.

$$V_{offset} = \frac{g_{mn1,2} \cdot \Delta V_{THN1,2} + g_{mp1,2} \cdot \Delta V_{THP1,2} +}{g_{mn1,2} + g_{mp1,2}} + \frac{g_{mn3,4} \cdot \Delta V_{THP3,4} + g_{mn3,4} \cdot \Delta V_{THN3,4}}{g_{mn1,2} + g_{mp1,2}} +$$

$$\frac{g_{mn1,2} \cdot (V_{GS} - V_{TH})_{N1,2} \cdot \left(-\frac{\Delta(W/L)}{(W/L)}\right)_{N1,2} +}{2 \cdot (g_{mn1,2} + g_{mp1,2})}$$

$$\frac{g_{mp1,2} \cdot (V_{GS} - V_{TH})_{P1,2} \cdot \left(\frac{\Delta(W/L)}{(W/L)}\right)_{P1,2}}{2 \cdot (g_{mn1,2} + g_{mp1,2})} +$$

Equation 2

-continued $$\frac{g_{mp3,4} \cdot (V_{GS} - V_{TH})_{P3,4} \cdot \left(\frac{\Delta(W/L)}{(W/L)}\right)_{P3,4} +}{2 \cdot (g_{mn1,2} + g_{mp1,2})}$$

$$\frac{g_{mp1,2} \cdot (V_{GS} - V_{TH})_{N3,4} \cdot \left(-\frac{\Delta(W/L)}{(W/L)}\right)_{N3,4}}{2 \cdot (g_{mn1,2} + g_{mp1,2})}$$

Where $g_{gm1,2}$, $g_{mp1,2}$, $g_{mp3,4}$ and $g_{mn3,4}$ each represent the transconductance of the matching stages 90, 92, 96, and 94. $\Delta V_{THN1,2}$, $\Delta V_{THP1,2}$, $\Delta V_{THP3,4}$ and $\Delta V_{THN3,4}$ each represent the difference in the threshold voltage $V_{TH}$ of two transistors in the matching stages 90, 92, 96, and 94. $V_{GS}$ represents gate-source voltage, W represents a width of a transistor, and L represents a length of a transistor.

After the step 52, to reduce the characteristic difference of two transistors matched to each other, that is, to reduce the offset, the sizes (L and W) of the transistor are determined using the interpretation results of the offset (step 54). The sizes of the transistor may be determined based on Equation 2. The sizes of the transistor may be obtained by the offset equation of the equation 2 and a low in Pelgrom's mismatch model. Generally, according to Pelgrom's mismatch model, the difference in two matching stages forms a normal distribution and a standard deviation thereof is in inverse proportion to a square root of an area. Therefore, the area of the input stages 90 and 92 is controlled according to the difference in the threshold voltage in the input stages 90 and 92 and the area of the active load stages 96 and 94 is controlled according to the difference in the threshold voltage in the active load stages 96 and 94. For example, reviewing the offset equation of the equation 2, it is sufficient to increase the area of the input stages 90 and 92 to reduce the difference $\Delta V_{THN1,2}$ and $\Delta V_{THP1,2}$ in the threshold voltage of the input stages 90 and 92. In a similar way thereto, it is sufficient to increase the area of the active load stages 96 and 94 to reduce the difference $\Delta V_{THP3,4}$ and $\Delta V_{THN3,4}$ in the threshold voltage of the active load stages 96 and 94.

Further, the transconductance of the active load stages 96 and 94 are multiplied by the differences $\Delta V_{THP3,4}$ and $\Delta V_{THN3,4}$ in the threshold voltages thereof and the transconductance of the input stages 90 and 92 are multiplied by the differences in the threshold voltages thereof. Therefore, to reduce the offset, the transconductance of the active load stages 94 and 96 and the transconductance of the input stages 90 and 92 are adjusted. For example, reducing the transconductance of the active load stages 94 and 96 and increasing the transconductance of the input stages 90 and 92 are also methods for reducing the offset. To reduce the offset, the length of the active load stages 94 and 96 may be adjusted. For example, an increase of the length of the active load stages 94 and 96 can increase the area thereof and reduce the transconductance so that it is very effective. Consequently, the size of the transistor may be determined using Equation 2.

After step 54, the yield is simulated using the measured matching information and the size of the determined transistor and the 'simulation yield' is obtained using the simulation results (step 56). More specifically, the measured matching information and the size of the determined transistor are simulated to obtain the normal distribution for the offset. To this end, Monte-Carlo of Hspice may be used. In this case, for example, a Netlist may be configured as follows:
Netlist param β__mc=aguass(0,Aβ,1)

Param vt__mc=aguass(0,AVT,1)

M1 d1 g1 s1 b nmos $W=(\text{width}*(1+\beta\_mc/\sqrt{(\text{width}*\text{length})}))$, $L=\text{length } DELVT0=vt\_mc/\sqrt{(\text{width}*\text{length})})$ M2 d2 g2 b nmos $W=(\text{width}*(1+\beta\_mc/)$, $L=\text{length } DELVT0=vt\_mc/\sqrt{(\text{width}*\text{length})})$ In the above Netlist, param represents a parameter and β is $\mu C_{OX}$ W/L (where μ represents mobility and $C_{OX}$ represents capacitance of oxide of transistor). Aβ and AVT are the measured matching information. Aβ represents a standard deviation for the difference of β of two transistors, and AVT represents a standard deviation for the difference in threshold voltage of two transistors.

Also, in the aforementioned Netlist, the information on mismatching is reflected in a width and the mismatching information for threshold voltage is reflected in DELVO to perform the simulation. The average and the standard deviation can appreciate through the normal distribution obtained through the aforementioned simulation. The 'simulation yield' can be obtained as the following equation 3 using the average and the standard deviation.

$$Y_{unit} = \int_{-limit}^{limit} \left(\frac{1}{\sqrt{2\pi}} e^{-\frac{z^2}{2}}\right), Z = \frac{\text{Limit}-m}{\sigma} \quad \text{Equation 3}$$

$$Y_{unit}^k$$

Where $Y_{unit}$ represents yield of a unit buffer, k represents the number of buffers prepared in the buffer stage 16, "limit" represents a maximum allowable value of the offset, and m and σ each represent the average and the standard deviation of the normal distribution obtained through step 56. As can be appreciated from equation 3, the yield is reduced with the increase of the number of buffers, so that the characteristic of the unit operational amplifier should be increased.

After step 56, the 'simulation yield' of the driver obtained by the simulation is compared to a 'targeted yield' (step 58). If the 'simulation yield' is not the 'targeted yield', the size of the matched transistors is revised (step 54). As such, the steps 54 and 56 are repetitively performed until the 'simulation yield' approximates the 'targeted yield'.

If the 'simulation yield' is the 'targeted yield', the determined size of the transistors is used to fabricate the chip of the driver, and the 'test yield' of the fabricated chip of the driver is obtained, for example, using the aforementioned Netlist and Equation 3 (step 60). The 'simulation yield' obtained by the simulation in the step 56 and the 'test yield' obtained for the fabricated chip are affected by the fabrication process, so that their yield may be varied. Therefore, it is judged whether the 'test yield' is the same as the 'targeted yield' (step 62).

If the "test yield' and the 'targeted yield' are different from each other, the measured matching information is adjusted (step 64). The simulation is performed using the adjusted matching information in the step 64, for example, by the above Netlist and Equation 3 to obtain the adjusted yield' of the driver (step 66). The 'adjusted yield' is then compared to the 'test yield' (step 68). If the 'adjusted yield' is not the same as the 'test yield', the process reverts to the step 64 to re-adjust the matching information (step 64). As such, the matching information is continuously adjusted until the 'adjusted yield' approximates the 'test yield'.

If the 'adjusted yield' is the same as the 'test yield', the matching information adjusted in step 64 is determined to be the final matching information (step 70). Also, if the 'test yield' is the same as the 'targeted yield', the measured matching information is determined to be the final matching information (step 70). After step 70, the design of the operational amplifier is completed using the final matching information (step 72).

As described above, the method for designing the driver according to embodiments derives the offset equation, adjusts the size of the transistor using the offset equation, finds the optimal size and the optimal matching information of the transistor while adjusting the matching information and the size through a simulation using the size, and completes the design of the operational amplifier using these parameters. The offset of the driver may be minimized, making it possible to improve output characteristics of the driver, optimize the area, improve the yield, reduce the frequency of revisions in the development of the chip, and/or shorten the period of the chip design.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising designing a driver with matching stages having matched transistors, wherein said designing by using a computer comprises:
    interpreting an offset caused by a mismatched characteristic difference of a plurality of transistors using a current change in a matching stage;
    determining a size of the transistors using the results of interpreting of the offset and re-determining the size until a simulated yield of the driver obtained by a simulation using measured matching information and the determined size of the transistors approximates a targeted yield;
    using a resulting determined size to fabricate the driver and obtaining a test yield of the manufactured driver; and
    if the test yield is not the targeted yield, adjusting the measured matching information until the adjusted yield of the driver obtained by the simulation approximates the test yield,
    wherein the driver corresponds to a source driver having a plurality of buffers and the matching stage is included in the respective buffer,
    wherein the matching stage comprises input stages having transistors matched to each other and active load stages having transistor matched to each other,
    wherein in the step of determining the size of the transistors, an area of the input stage is increased according to the difference in threshold voltage in the input stage, and an area of the active load stage is increased according to the difference in threshold voltage in the active load stage, and
    wherein the step of determining the size of the transistors further comprising reducing a transconductance of the active load stage, increasing a transconductance of the input stage, and increasing a length of the active load stage for reducing the offset.

2. The method of claim 1, comprising completing the design of the driver using the resulting adjusted matching information when the adjusted yield approximates the test yield.

3. The method of claim 1, comprising completing the design of the driver using the measured matching information if the test yield is the targeted yield.

4. The method of claim 1, comprising determining the structure of the matching stage prior to interpreting an offset.

5. The method of claim 1, wherein the size of the matched transistors is obtained using the interpretation results of the offset and a low in Pelgrom's mismatch model.

6. The method of claim 1, wherein the difference in the characteristic of the matched transistors corresponds to the difference in threshold voltage of the transistors.

7. The method of claim 1, wherein the step of obtaining the simulation yield comprises:
   obtaining a normal distribution for an offset by the simulation of the measured matching information and the determined size of the transistor; and
   obtaining the simulation yield using the average and the standard deviation obtained in the normal distribution.

8. A method for performing by using a computer comprising:
   determining an initial structure of an operational amplifier including matching stages with matched transistors;
   interpreting an offset caused by a mismatch characteristic in a plurality of transistors;
   determining a size of the transistors using the results of interpreting of the offset;
   performing a yield simulation;
   comparing a simulated yield value to a targeted yield value;
   adjusting the size of the transistors if the simulated yield value does not approximate the targeted yield value;
   fabricating a driver to obtain a test yield value if the simulated yield value approximates the targeted yield value;
   comparing the test yield to the targeted yield;
   adjusting the simulation parameters if the test yield value does not approximate the targeted yield value; and
   completing the design using the adjusted sizes of the transistors if the test yield value approximates the targeted yield value,
   wherein the driver corresponds to a source driver having a plurality of buffers and the matching stage is included in the respective buffer,
   wherein the matching stage comprises input stages having transistors matched to each other and active load stages having transistor matched to each other,
   wherein in the step of determining the size of the transistors, an area of the input stage is increased according to the difference in threshold voltage in the input stage, and an area of the active load stage is increased according to the difference in threshold voltage in the active load stage, and
   wherein the step of determining the size of the transistors further comprising reducing a transconductance of the active load stage, increasing a transconductance of the input stage, and increasing a length of the active load stage for reducing the offset.

9. The method of claim 8, wherein adjusting the simulation parameters comprises adjusting measured matching information.

10. The method of claim 9, further comprising performing the yield simulation using the adjusted measured matching information.

11. The method of claim 10, comprising repetitively re-determining the size until simulation yield of the driver obtained by the simulation using measured matching information and the determined size of the transistors approximates a targeted yield to reduce the characteristic difference.

* * * * *